United States Patent
Christensen et al.

(10) Patent No.: US 12,182,456 B2
(45) Date of Patent: *Dec. 31, 2024

(54) IMAGE DATA BASED MEDIA TYPE SELECTION BASED ON A FIRST IDENTIFIED ATTRIBUTE OF THE INITIAL IMAGE DATA

(71) Applicant: Lodestar Licensing Group, LLC, Evanston, IL (US)

(72) Inventors: Carla L. Christensen, Boise, ID (US); Zahra Hosseinimakarem, Boise, ID (US); Bhumika Chhabra, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,598

(22) Filed: Nov. 13, 2023

(65) Prior Publication Data
US 2024/0078052 A1 Mar. 7, 2024

Related U.S. Application Data

(63) Continuation of application No. 17/591,977, filed on Feb. 3, 2022, now Pat. No. 11,815,933, which is a
(Continued)

(51) Int. Cl.
*G06F 3/00* (2006.01)
*G06F 3/06* (2006.01)
(Continued)

(52) U.S. Cl.
CPC .......... *G06F 3/0685* (2013.01); *G06F 3/0607* (2013.01); *G06F 3/0647* (2013.01);
(Continued)

(58) Field of Classification Search
CPC .... G06F 3/0685; G06F 16/583; G06F 16/535; G06F 3/0607; G06F 3/0647; G06V 40/10; G06V 40/19; G06V 20/00; G11C 11/005
See application file for complete search history.

(56) References Cited

U.S. PATENT DOCUMENTS 8,427,891 B2    4/2013    Best
8,886,899 B1    11/2014    Bao
(Continued)

OTHER PUBLICATIONS

International Search Report and Written Opinion from related international applicatoin No. PCT/US2021/014856, dated May 12, 2021, 9 pages.

*Primary Examiner* — Tammara R Peyton
(74) *Attorney, Agent, or Firm* — Brooks, Cameron & Huebsch, PLLC

(57) ABSTRACT

Systems, apparatuses, and methods related to image based media type selection are described. Memory systems can include multiple types of memory media (e.g., volatile and/or non-volatile). Determinations of which memory media types to write image data to can be made and the data can be written (e.g., stored) in the determined type of memory media. A determined memory media type can be based on attributes of the data. In an example, a method can include receiving, by a memory system that comprises a plurality of memory media types, initial image data from an image sensor coupled to the memory system, identifying one or more attributes of the initial image data, determining a type of memory media to write the initial image data to based on the identified attributes of the initial image data, and selecting, based at least in part on the determined type of memory media, a first memory type of the plurality of memory media types to write the initial image data.

16 Claims, 7 Drawing Sheets

Related U.S. Application Data continuation of application No. 16/806,593, filed on Mar. 2, 2020, now Pat. No. 11,275,521.

(51) Int. Cl.
- *G06F 16/535* (2019.01)
- *G06F 16/583* (2019.01)
- *G06V 20/00* (2022.01)
- *G06V 40/10* (2022.01)
- *G06V 40/19* (2022.01)
- *G11C 11/00* (2006.01)
- *G06V 40/16* (2022.01)

(52) U.S. Cl.
CPC .......... *G06F 16/535* (2019.01); *G06F 16/583* (2019.01); *G06V 20/00* (2022.01); *G06V 40/10* (2022.01); *G06V 40/19* (2022.01); *G11C 11/005* (2013.01); *G06V 40/174* (2022.01)

(56) References Cited

U.S. PATENT DOCUMENTS

| | | | |
|---|---|---|---|
| 8,922,676 | B2 | 12/2014 | McNaughton |
| 9,578,249 | B2 | 2/2017 | Yoon |
| 10,855,768 | B2 | 12/2020 | Cooper |
| 11,275,521 | B2 | 3/2022 | Christensen |
| 11,397,526 | B2 * | 7/2022 | Hosseinimakarem ........ G06F 3/0604 |
| 11,815,933 | B2 * | 11/2023 | Christensen .......... G06F 3/0647 |
| 2004/0184296 | A1 | 9/2004 | Vyvoda et al. |
| 2006/0279643 | A1 | 12/2006 | Levien |
| 2012/0117304 | A1 * | 5/2012 | Worthington ....... G06F 11/3037 711/170 |
| 2016/0018990 | A1 | 1/2016 | Yun |
| 2018/0338108 | A1 * | 11/2018 | Brady .................. H04N 5/765 |
| 2019/0082011 | A1 | 3/2019 | Cooper |

* cited by examiner

IMAGE DATA BASED MEDIA TYPE SELECTION BASED ON A FIRST IDENTIFIED ATTRIBUTE OF THE INITIAL IMAGE DATA

PRIORITY INFORMATION

This application is a Continuation of U.S. application Ser. No. 17/591,977, filed on Feb. 3, 2022 which is a Continuation of U.S. application Ser. No. 16/806,593, filed Mar. 2, 2020, which issued as U.S. Pat. No. 11,275,521 on Mar. 15, 2022, the contents of which are incorporated herein by reference.

TECHNICAL FIELD

The present disclosure relates generally to semiconductor memory and methods, and more particularly, to apparatuses, systems, and methods for image data based media type selection.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to write (e.g., store) data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
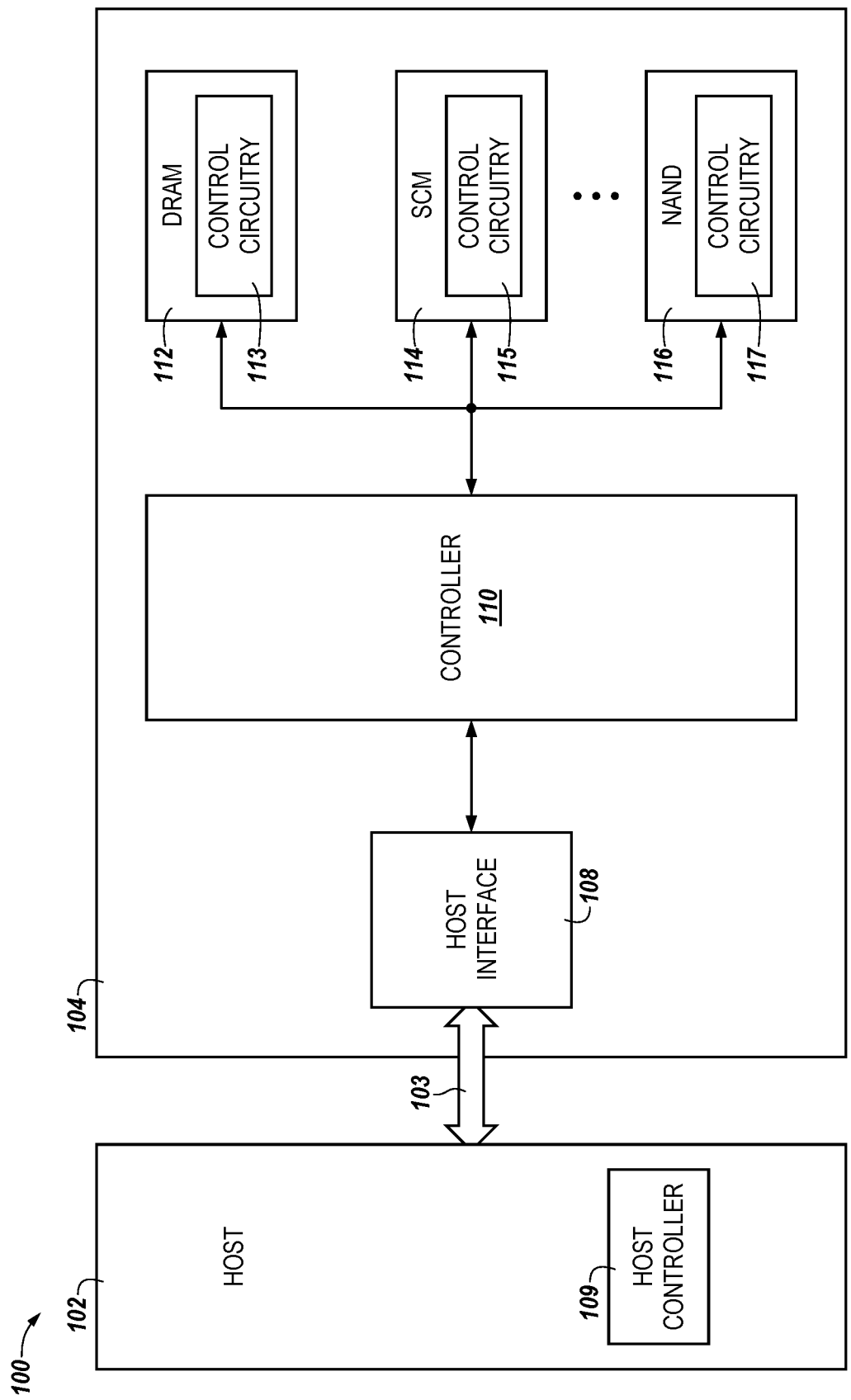
FIG. 1 is a functional block diagram in the form of a computing system including an apparatus in the form of a memory system in accordance with a number of embodiments of the present disclosure.

Systems, apparatuses, and methods related to image data based media type selection are described. Memory systems can include multiple types of memory media (e.g., volatile and/or non-volatile) and can write data to the various memory media types. The data that can be written to memory media can vary based on attributes such as source, quality of the data, metadata, and/or information included in the data. Data received by a memory system can be written (e.g., stored) in a particular type of memory media based on one or more settings applied to the data. In an example, a method can include receiving, by a memory system that comprises a plurality of memory media types, initial image data from an image sensor coupled to the memory system, identifying one or more attributes of the initial image data, determining a type of memory media to write the initial image data to based on the attributes of the initial image data, and selecting, based at least in part on the determined type of memory media, a first memory type of the plurality of memory media types to write the initial image data.

As used herein, writing data can include storing data to a memory media. For example, data can be stored to a memory media by writing the data to a memory media of a memory device. In addition, the data can also be retrieved by a computing device from its place of storage. As used herein, the term "setting" refers to a deterministic guideline to direct data to a particular memory media type. The term setting, in some instances, can be a memory media type to which it is determined to write data (e.g., image data). In some examples, a setting may be referred to as a determined memory media type. For instance, a particular memory media type can be selected from multiple tiers of memory media types based on characteristics of the memory media type and the ruled applied to the data based on attributes. Characteristics of the memory media type can include volatility, non-volatility, power usage, read/write latency, footprint, resource usage, and/or cost. For example, a rule can establish a memory media type to write data to by anticipating more frequent access to the data or having a pre-determined or machine learned preference for fast access (e.g., a most responsive memory media type available among a plurality of memory media types).

A computing system including memory systems can include one or more different memory media types which can be used to write data in a computing system. Such data can be transferred between a host associated with the computing system and the memory system. The data written in memory media can be important or even critical to operation of the computing system and/or the host. There are various types of memory media, and each type of memory media includes characteristics that may be unique to the memory media type. As used herein, types of memory media can include, among others, non-volatile memory and volatile memory.

For example, non-volatile memory can provide persistent data by retaining written data when not powered, and non-volatile memory types can include NAND flash memory, NOR flash memory, read only memory (ROM), Electrically Erasable Programmable ROM (EEPROM), Erasable Programmable ROM (EPROM), and Storage Class Memory (SCM) that can include resistance variable memory, such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory. Volatile memory can require power to maintain its data (e.g., host data, error data, etc.), and volatile memory types can include random-access memory (RAM), dynamic random access memory (DRAM), and static random access memory (SRAM), among others. The characteristics of different memory media types can include features that cause tradeoffs related to performance, storage density, energy requirements read/write speed, cost, etc. In some examples, some memory media types may be faster to read/write as compared to other memory media types but less cost effective than other memory media types. In other examples, memory media types may be faster as compared to other memory media types but consume a large amount of power and reduce the life of a battery, while other memory media types can be slower and consume less power.

As hosts such as mobile devices, semi-autonomous vehicles, fully autonomous vehicles, mobile artificial intelligence systems, etc. become more prevalent, sensors and other devices related to computing systems and hosts are also increasingly prevalent. For example, a host can be a mobile device that includes one or more image sensors (e.g., cameras) to generate image data (e.g., photographs, images, video, etc.). The image sensor(s) can produce frequent and/or large quantities of image data which can be used by a computing system, a host, a user interface corresponding to a host, and/or a user to make decisions related to the operation of the host (e.g., a memory media type to write the image data). Large quantities of image data can be generated and determining a memory media type to write the image data can be tedious and error prone.

For example, some image data generated can include attributes, and the attributes can be deemed desirable or undesirable based on a preference of a user and/or a host. As used herein, the term "attribute" refers to aspects of the image data. Examples, of an attribute can include a location of the sensor (relative to the host) that generated the image data, image data with a subject that is out of focus, a facial expression of the subject (e.g., smiling or not smiling), facial features of the subject (e.g., eyes open or closed), subject blur, pixel characteristics, pixel density, subject features (sitting, standing, eyes open, etc.), image data with a subject that is out of frame, undesired subjects in the background or foreground, repetitive images of the same subject, repetitive images of the same geographical location, etc. Writing undesired (e.g., repetitive) image data in memory media can occupy valuable memory media space, waste power, and/or waste resources that could otherwise be used by desired image data. Balancing the tradeoffs between various different memory media types to write the frequent and/or large quantities of image data can be an important endeavor.

In some approaches, data may be written to a memory system based on an order in which the data arrives from an origin or by another predetermined schema and is automatically written to a particular memory media type. This approach can cause the retrieval or interpretation of the data to be slow, ineffective, costly, and/or otherwise waste resources of the computing system (e.g., host). As a result, the tradeoffs of a computing system writing data to particular memory media types can become more pronounced. Said differently, writing image data according to a predetermined schema can result in non-important image data occupying space in a memory media type that is better suited for important (e.g., desired and/or critical) data, and critical data may be confined to a media type that is slower to access. This can lead to inefficient operation of the host and/or error in retrieving critical (e.g., desired) data from memory media on the memory system.

As mentioned, host devices can include communicatively coupled devices (e.g., sensors) which may be intermittently or consistently generating data to be written to memory media of a memory system. As writing (e.g., storage) capability of memory systems increase and the volume of generated data increases, the effects of inefficient data storage becomes more tedious and pronounced. These effects can be further exacerbated by the limitations of some approaches to read and interpret data such that the contents can be effective, especially as the amount of data written in memory systems and the speed at which data retrieval is expected.

In contrast, embodiments herein are directed to writing data generated from devices communicatively coupled to a memory system (e.g., sensors generating data) based on settings created based on attributes of the data (e.g., image data), a context of the host device (e.g., a geographical location), or combinations thereof. Writing data based on the settings generated can determine an appropriate memory media type to best utilize resources (e.g., power, space, cost, etc.). Apply a setting, for instance, can include determining a type of memory media to write data (e.g., image data) to. The input can be a calibration process where a user (of a host) establishes a threshold related to the attribute, and image data that is above or below the threshold can be written to a particular memory media type and/or deleted. In some embodiments, rather than being automatically deleted, image data can be written to a particular memory media type to be later reviewed for deletion. As more image data is generated, the memory system can generate new settings with new thresholds, and/or alter existing settings based on input from the host (e.g., a user). In other words, a threshold can be pre-established, or machine learned from input received, and a setting can be established based on the threshold.

As mentioned, a setting can be generated based on input from the host (e.g., a user) related to attributes of image data generated by an image sensor, and the setting can be applied to subsequently generated image data. Responsive to the application of the setting, a particular memory media type can be selected and/or the subsequently generated image data can be deleted or written to a selected memory media type to be reviewed for deletion. For example, in a context of mobile devices, decisions related to image data received from an image sensor may be made quickly and efficiently, and latency in retrieval or storage can be undesirable. In such examples, image data that is undesired can be deleted or stored in a less accessible memory media (e.g., NAND) and image data that is desirable can be written to a memory media that includes quick retrieval features (e.g., DRAM).

The selection of a memory media type from a multiple memory media types, of which to write the image data received, can be made by a memory system controller and/or a host controller. A memory system controller can be a controller or other circuitry which is coupled to the memory system. The memory system controller can include hardware, firmware, and/or software to determine attributes of the incoming data and select a memory media type to write the data. A host controller can be a controller or other circuitry which can be communicatively coupled to the memory system to determine attributes of the incoming data and select a memory media type to write the data.

Embodiments herein can allow a memory system including multiple memory media types to selectively determine which memory media type is appropriate for the incoming image data, based at least in part, on settings generated from the attributes of the data, input received about the attributes, a context of the host, and/or a combination thereof. As will be described herein, in some embodiments, data previously written to a particular memory media type can be transferred to a different memory media type, based on time, incoming data, a change in an existing setting, and/or the generation of a new setting, among others.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, designators such as "N," etc., particularly with respect to reference numerals in the drawings, indicate that a number of the particular feature so designation can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures can be identified by the use of similar digits. For example, 106 can reference element "06" in FIG. 1, and a similar element can be referenced as 206 in FIG. 2. A group or plurality of similar elements or components can generally be referred to herein with a single element number. For example, a plurality of reference elements 330-1, . . . , 330-N (e.g., 330-1 to 330-N) can be referred to generally as 330. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a memory system 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory system 104 can include a host interface 108, a controller 110, (e.g., a processor, control circuitry, hardware, firmware, and/or software) and a number of memory media devices each including control circuitry.

FIG. 1 illustrates a non-limiting example of multiple memory media types in the form of a DRAM 112 including control circuitry 113, SCM 114 including control circuitry 115, and a NAND 116 including control circuitry 117. While three memory media types (e.g., DRAM 112, SCM 114, and/or NAND 116) are illustrated, embodiments are not so limited, however, and there can be more or less than three memory media types. Further, the types of memory media are not limited to the three specifically illustrated (e.g., DRAM 112, SCM 114, and/or NAND 116) in FIG. 1, other types of volatile and/or non-volatile memory media types are contemplated. In a number of embodiments, the controller 110, the memory media DRAM 112, SCM, 114, and NAND 116, and/or the host interface 108 can be physically located on a single die or within a single package, (e.g., a managed memory application). Also, in a number of embodiments, a plurality of memory media (e.g., DRAM 112, SCM, 114, and NAND 116), can be included on a single memory system 104.

As illustrated in FIG. 1, the controller 110 can be coupled to the host interface 108 and to the memory media DRAM 112, SCM 114, and NAND 116 via one or more channels and can be used to transfer data between the memory system 104 and a host 102 having a host controller 109. The host interface 108 can be in the form of a standardized interface. For example, when the memory system 104 is used for data storage in a computing system 100, the interface 108 can be a serial advanced technology attachment (SATA), peripheral component interconnect express (PCIe), or a universal serial bus (USB), a double data rate (DDR) interface, among other connectors and interfaces. In general, however, interface 108 can provide an interface for passing control, address, data, and other signals between the memory system 104 and a host 102 having compatible receptors for the host interface 108.

In some examples, the controller 110 can include a mode register that can be programmed to indicate the determined type of memory media. For example, the mode register can be directed by the controller 110 to be programmed to a first setting such that the determined type of media memory is example DRAM 112, to a second setting such that the determined type of media memory is SCM 114, or a third setting such that the determined type of media memory is NAND 116, among others.

The host 102 can be a host system such as a personal laptop computer, a vehicle, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices such as a number of processing resources (e.g., one or more processors, microprocessors, image processor, and/or some other type of controlling circuitry). One of ordinary skill in the art will appreciate that "a processor" can intend one or more processors, such as a parallel processing system, a number of coprocessors, etc. The host 102 can be coupled to a host interface 108 of the memory system 104 by a communication channel 103.

As used herein an "IoT enabled device" can refer to devices embedded with electronics, software, sensors, actuators, and/or network connectivity which enable such devices to connect to a network and/or exchange data. Examples of IoT enabled devices include mobile phones, smart phones, tablets, phablets, computing devices, implantable devices, vehicles, home appliances, smart home devices, monitoring devices, wearable devices, devices enabling intelligent shopping systems, among other cyber-physical systems.

In some embodiments, the host 102 can be responsible for executing an operating system for a computing system 100 that includes the memory system 104. Accordingly, in some embodiments, the host 102 can be responsible for controlling operation of the memory system 104. For example, the host 102 can execute instructions (e.g., in the form of an operating system) that manage the hardware of the computing system 100 such as scheduling tasks, executing applications, controlling peripherals, etc.

The computing system 100 can include separate integrated circuits or the host 102, the memory system 104, the host interface 108, the controller 110, and/or the memory media DRAM 112, SCM 114, and/or NAND 116 can be on the same integrated circuit. The computing system 100 can be, for instance, a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

Although not illustrated in FIG. 1 as to not obscure the examples of the disclosure, the memory system 104 can be communicatively coupled (e.g., connected) to sensors which can be communicatively coupled to the host 102. The term "communicatively coupled" means directly or indirectly connected and, unless stated otherwise, can include a wireless connection. As used herein, the term "sensor" refers to a device that can generate and send data and/or receive data. Some examples of sensors can include temperature devices, imaging devices (e.g., cameras), video devices, audio devices, motion devices, IoT enabled devices (e.g., vehicle electronic control unit (ECU) devices, thermostats, bulbs, locks, security systems, toothbrushes, pet feeders, etc.), among others. The sensors may transmit data to be written in the memory system 104. For example, the controller 110 can be coupled to a plurality of memory media types (e.g., the memory media DRAM 112, SCM, 114, and NAND 116) to receive data from the plurality of sensors.

The controller 110 (and/or the host controller 109) can receive data multiple times from an individual sensor or from multiple sensors. For example, the host 102 can be a mobile device with one or more cameras (e.g., image sensors), and the one or more cameras can generate one or more photographs and/or videos (e.g., image data). The controller 110 can identify one or more attributes of the image data. For example, the controller 110 can identify a blur (or lack thereof) of a subject, a portion of a subject that is out of frame or otherwise visually obstructed from the image, and/or a facial expression or feature of the subject, etc. The controller 110 and/or the host controller 109 can receive input about the attributes, and based on the input, generate a setting to apply to the image data. The setting can determine a type of memory media to write the image data and/or the setting can determine to refrain from writing the image data (e.g., the setting can determine to delete the image data).

As mentioned, a setting can be determined by input. As used herein, the term "input" refers to information about attributes included in the image data. Input can be received by the controller 110 and/or the host controller 109 from a user of the host 102, from the host 102 via a user configurable setting, and/or from a default setting of the host 102. For example, an input can be a user discarding (e.g., deleting) an image (e.g., image data) based on an attribute, and/or selecting a particular memory media type to write the image data. The controller 110 and/or the host controller 109 can generate a setting based on a pattern of input. In a non-limiting example, a user may provide input that deletes image data where the subject is blurry (e.g., a blur attribute) and writes additional image data (having a non-blurry attribute) in a particular memory media type. The controller 110 and/or the host controller 109 can generate a setting that includes a subject blur threshold and prompt the user (e.g., and/or the host 102) to either accept or reject the setting. If accepted, the controller 110 and/or the host controller 109 can apply the subject blur setting to subsequent image data generated by the host 102 where the threshold determines if subsequently received image data should be written to a particular type of media or deleted (or written to a different memory media type). Said differently, the controller 110 and/or the host controller 109 can generate a setting (e.g., the subject blur setting) based on a pattern of input that can delete image data that is above/below a blur threshold.

In another non-limiting example, the controller 110 and/or the host controller 109 can receive input where a first image data (a first photograph) from a particular geographical location (e.g., a geographical attribute) is written to a first memory media type, and a second and third image data (e.g., a second and a third photograph) are written to a second memory media type. The controller 110 and/or the host controller 109 can generate a setting that includes a quantity threshold of image data from a particular geographical location and prompt the user (e.g., and/or the host 102) to either accept or reject the setting. If accepted, the controller 110 and/or the host controller 109 can apply the quantity threshold setting to subsequent image data generated by the host 102 where the threshold determines if subsequently received image data should be written to a first memory media type or a second memory media type. Said differently, a user can opt to accept a setting that will refrain from writing image data that include the same geographical location (e.g., multiple photographs of a particular landmark or building).

In yet another non-limiting example, a user and/or the host 102 may provide input to the controller 110 and/or the host controller 109 that can cause the controller 110 to delete image data where the subject is out of frame and/or otherwise obstructed (e.g., an obstruction attribute) and writes additional image data (having non-obstructed subjects) in a particular memory media type. The controller 110 and/or the host controller 109 can generate a setting that includes a subject obstructed threshold and prompt the user (e.g., and/or the host 102) to either accept or reject the setting. If accepted, the controller 110 and/or the host controller 109 can apply the subject obstructed setting to subsequent image data generated by the host 102 where the threshold is used to determine if subsequently received image data (e.g., subsequently generated photographs) should be written to a particular type of media or deleted (or written to a different memory media type).

The controller 110 and/or the host controller 109 can be configured to apply one or more settings to incoming image data (e.g., one or more incoming photographs). For example, the controller 110 and/or the host controller 109 can apply a facial expression setting (e.g., photographs of smiling subjects are desired) and a subject obstruction setting (e.g., a threshold of the subject to be unobstructed) to incoming image data (e.g., photographs) generated by a camera (e.g., an image sensor). Where applicable, the settings can be applied to the incoming image data. The image data that includes an unobstructed subject and/or a smiling subject can be written to a first memory media type such as DRAM 112. The image data that includes an obstructed subject and/or a subject that is not smiling can be written to a different memory media type such as SCM 114 or NAND 116, or automatically deleted.

Figure 2:
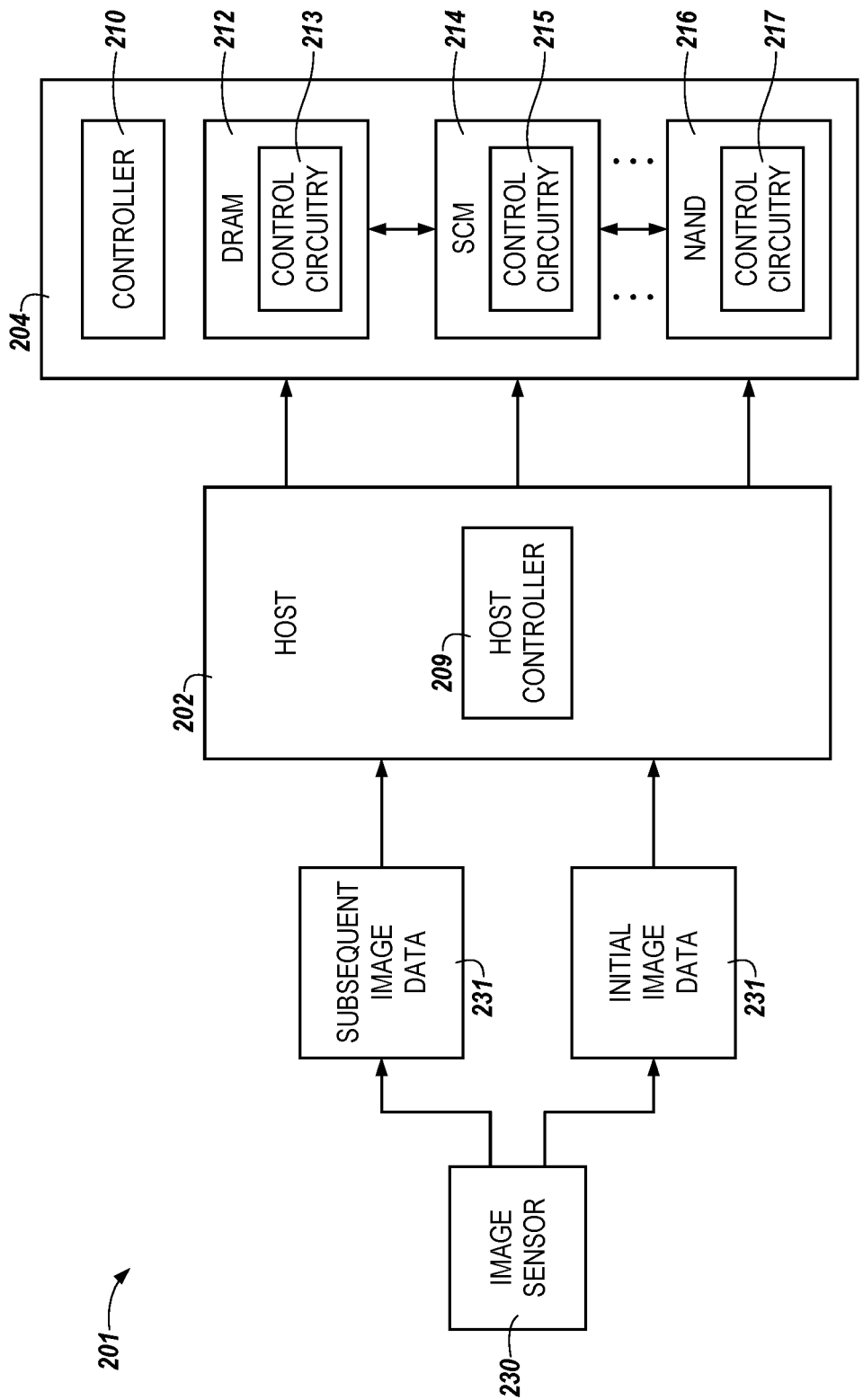
FIG. 2 is a functional block diagram in the form of a computing system including multiple memory media types in accordance with a number of embodiments of the present disclosure.

FIG. 2 is a functional block diagram in the form of a computing system 201 including multiple memory media types in accordance with a number of embodiments of the present disclosure. FIG. 2 illustrates a computing system 201 which includes a host 202, including a host controller 209 which can be analogous to the host 102 and host controller 109 described in connection with FIG. 1. Computing system 201 includes a controller 210 which can be analogous to the controller 110 described in connection with FIG. 1. The computing system 201 can include image sensor 230, which can be communicatively coupled to the host 202 and produce initial image data 231.

The host 202 can be communicatively coupled to the sensors 230 via a physical connection (e.g., via wiring, circuitry, etc.) or remotely coupled (e.g., via a wireless signal, near field communication, Bluetooth, Bluetooth Low Energy, RFID, etc.). The host 202 can be communicatively coupled to one or more memory media types. FIG. 2 illustrates a non-limiting example of multiple memory media types in the form of a DRAM 212 including control circuitry 213, SCM 214 including control circuitry 215, and a NAND 216 including control circuitry 217. The host 202 can receive the initial image data 231 generated by the image sensor 230.

The embodiment illustrated in FIG. 2 illustrates an example of the image sensor 230 (e.g., a camera) transmitting initial image data 231 (e.g., one or more photographs) to the host 202 (e.g., a mobile device) having a host controller 209, where the host controller 209 receives the initial image data 231 from the image sensor 230. The host controller 209 and/or the controller 210 can analyze the initial image data 231 for attributes. The host can be a mobile device (e.g., a smart phone) with a display that can display the initial image data 231 to a user. The host controller 209 and/or the controller 210 can receive input from a user and/or the host 202 and generate a setting based on the input.

The generated setting can be based on attributes related to a quality of subjects in the image data. The image data can be a photograph, or an image generated by a camera (e.g., image sensor 230). A photograph may include a subject such as a human, animal, nature, etc. and the attributes of the image data can be related to the quality of the subjects in the image data. The quality can be subjective to a user and/or host 202 and include perceived blur of the subjects, focus of the subjects, unwanted (e.g., unintended) objects (humans and/or animals) in the image, and/or an open eye status of a human or animal subject, etc. The perception of quality of the subject can be interpreted as a setting when input is received from a user and/or host 202 perceiving the images as they are generated by the image sensor 230.

The setting can be generated responsive to input received about initial image data 231, and based on that input, a memory media type of a plurality of memory media types can be selected to write the initial image data 231. For example, the computing system 201 can include a mobile device (e.g., the host 202) that includes a plurality of memory media types DRAM 212, SCM 214, and NAND 216 coupled to a controller 210. The controller 210 can be configured to receive initial image data 231 from an image sensor 230. The host controller 209 and/or the controller 210 can identify an attribute of the initial image data 231. The attribute can be information about a subject included in the initial image data 231 and details about the subject (e.g., is the subject blurry, etc.). The host controller 209 and/or the controller 210 can receive initial input from a user and/or the host 202 about the attribute of the initial image data 231. The initial input can be received by the host controller 209 and/or the controller 210 responsive to a prompt generated by the host controller 209 and/or the controller 210 for the initial input. The host controller 209 and/or the controller 210 can generate a prompt for input so that a setting can be generated about the attribute. Additionally, or alternatively, the host controller 209 and/or the controller 210 can monitor the computing system 201 for input received from a user and/or the host 202 about the initial image data 231 and generate one or more settings based on the initial input.

Based on the initial input received from a user and/or the host 202, the host controller 209 and/or the controller 210, can determine a setting based on the attribute of the initial image data 231 and the initial input, where the initial input identifies one or more thresholds related to the attribute. For example, the initial input received about the attribute of the initial image data 231 can be related to an amount of blurriness of the subject and a threshold amount of blurriness can be used to generate a setting. The host controller 209 and/or the controller 210 can assign the setting (e.g., the subject blurriness setting) based on the received initial input, to the initial image data 231 where the setting can determine a memory media type (e.g., DRAM 212, SCM 214, and/or NAND 216) to write the initial image data 231.

For example, the host controller 209 and/or the controller 210 can write, based on the assigned setting, the initial image data 231 to a first memory media type (e.g., DRAM 212) of the plurality of memory media types (e.g., DRAM 212, SCM 214, and/or NAND 216). The setting (e.g., the subject blurriness setting) can be applied to subsequent image data 233 received by the host 202 from the image sensor 230.

For example, the host controller 209 and/or the controller 210 can receive subsequent image data 233 from the image sensor 230. The host controller 209 and/or the controller 210 can determine attributes of the subsequent image data 233 and apply the setting to the attributes of the subsequent image data 233. Based on the application of the setting determined from the initial input, the host controller 209 and/or the controller 210 can write the subsequent image data 233 to one or more of the plurality of memory media types (e.g., DRAM 212, SCM 214, and/or NAND 216) based at least in part on the setting.

As more image data is generated by the image sensor 230, additional input may be received by the host controller 209 and/or the controller 210. The additional input can be related to different attributes of the image data or the same attribute. For example, the host controller 209 and/or the controller 210 can be configured to receive new input about attributes of subsequent image data 233 received from the image sensor 230, and the new input and the initial input are different. For example, the new input can be used to identify changes to the one or more thresholds related to the attributes of the subsequent image data 233 and to apply a new setting to the subsequent image data 233 based in part on the new input. Said differently, the new input can be received from a user indicating that the threshold of subject blur from the previous setting (generated based on the initial input) is no longer desirable. In this example, a new threshold of subject blur can be determined for the new setting and applied to subsequent image data 233.

The change in threshold and development of a new setting can alter the location of the initial image data 231. For example, the initial image data 231 may have been previously written in DRAM 212 and based on the generation of the new setting from the new input, the initial image data 231 may move from DRAM 212 to SCM 214, NAND 216, and/or deleted from the computing system 201.

The subsequent image data 233 generated from the image sensor 230 may include a number of portions. Said differently, the image sensor 230 can be a camera on a mobile device host 202, and the subsequent image data 233 can be a group of image data (e.g., a group of photographs) with different attributes. The host controller 209 and/or the controller 210 can be configured to apply the new setting (generated based on the new inputs and including the new threshold for subject blur). The host controller 209 and/or the controller 210 can write a first portion of the subsequent image data 233 to the first memory media type (e.g., DRAM 212) based on the new setting, transfer the initial image data 231 from the first memory media type (DRAM 212) to a second memory media type (e.g., SCM) responsive to the new setting, and discard a second portion of the subsequent image 233 data based on the new setting.

Figure 3:
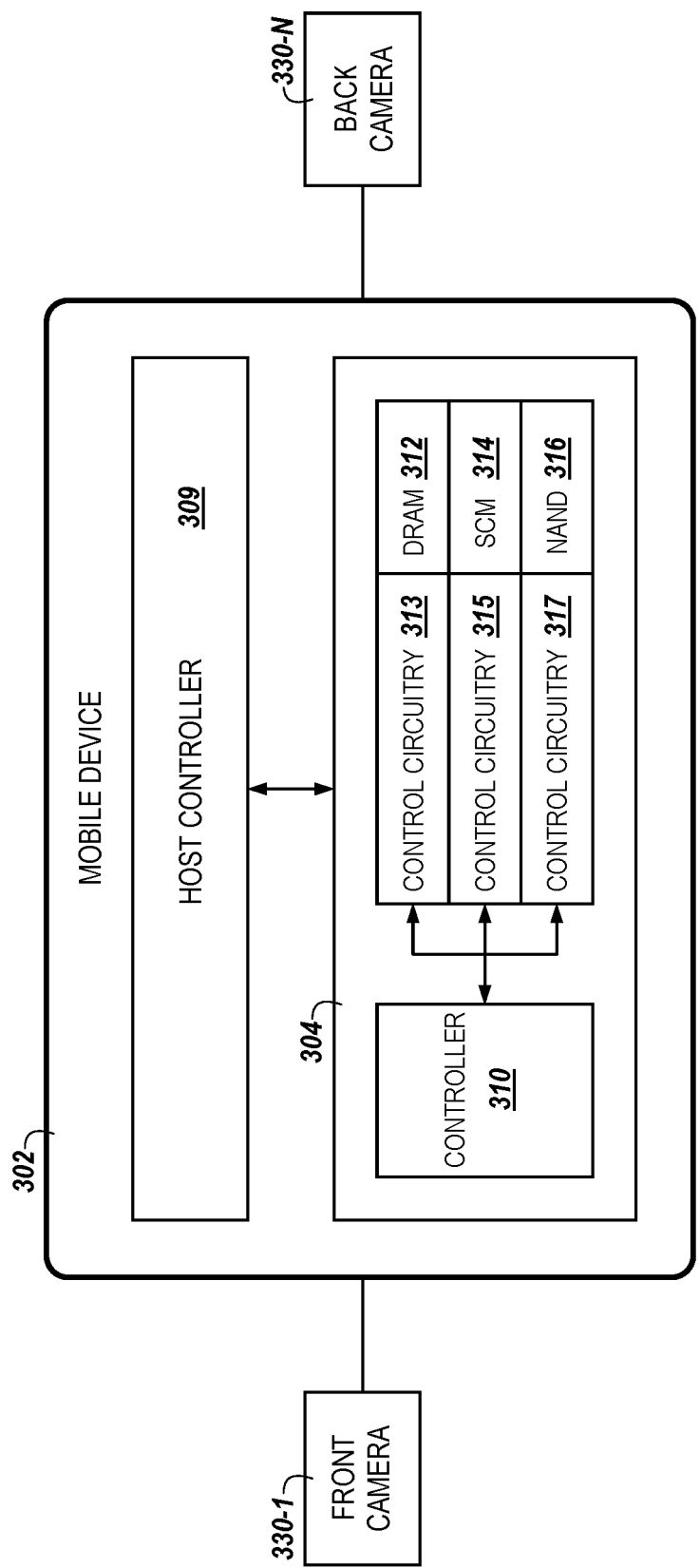
FIG. 3 is a diagram of a memory system including multiple memory media types coupled to a host in the form of a mobile device in accordance with a number of embodiments of the present disclosure.

FIG. 3 is a diagram of a memory system 304 including multiple memory media types coupled to a host 302 in the form of a mobile device in accordance with a number of embodiments of the present disclosure. The host 302 can include a host controller 309 which can be analogous to the host 102 and host controller 109 respectively described in connection with FIG. 1. The host 302 can be communicatively coupled to image sensors in the form of a front camera 330-1 and a back camera 330-N which can be generally referred to as the cameras 330 and be analogous to image sensor 230 described in connection with FIG. 2. The host 302 can include a memory system 304 which can be analogous to memory system 104 described in connection with FIG. 1 and include multiple memory media types. The memory system 304 can include a DRAM 312 including control circuitry 313, a SCM 314 including control circuitry 315, and a NAND 316 including control circuitry 317. Embodiments are not so limited, however, and memory system 304 can include any number or combination of memory media types (e.g., non-volatile and/or volatile).

The example host 302 is in the form of a mobile device (e.g., an IoT enabled device). An IoT enabled device can include mobile phones, smart phones, tablets, phablets, computing devices, implantable devices, vehicles, home appliances, smart home devices, monitoring devices, wearable devices, devices enabling intelligent shopping systems, among other cyber-physical systems. The cameras 330 can include multiple types of cameras (e.g., video or static) located on the mobile device host 302. The location and/or operation of the cameras 330 can be an attribute of the image data and be used to generate a setting. For example, image data (e.g., photographs) generated by the front camera 330-1 may have similar or different settings than the back camera 330-N.

For example, a user of the mobile device 302 may provide different input about photographs generated from the front camera 330-1. A photograph generated from the front camera 330-1 may be a photograph taken by the user of the user (e.g., a selfie). The input about such a photograph from the front camera 330-1 can reflect what a user deems desirable for a selfie style photograph. Such input may be focused on facial expression, eyes open or closed, mouth open or closed, etc. In contrast, photographs taken by the back camera 330-N may elicit different input. For example, photographs generated from the back camera 330-N may be of people, nature scenery, animals, objects, etc. The input received about photographs taken using the back camera 330-N may be about attributes such as focus, blur of the subject, unwanted or unintentional people or, animals or objects in the frame, etc.

In some embodiments, the multiple settings can be generated and/or applied based on the location of the camera 330 (e.g., image sensor) relative to the host 302. The host controller 309 and/or the controller 310 can receive image data (e.g., photographs) from one or more of the cameras 330 (e.g., image sensors) and identify one or more attributes of the image data. In this example, the image data is received from the mobile device 302 comprising a camera lens within the cameras 330 and the received image data includes a plurality of photographs. The one or more attributes can include a location of the cameras 330 (e.g., image sensor) relative to the host 302. Additionally, or instead of, the one or attributes can include one of a quantity of similar subjects within the plurality of photographs, pixel quality of the photographs, and a geographical location of the plurality of photographs, a quality of the subject in the pictures, etc.

A user of the mobile device 302 can provide input about attributes of the received photographs from the cameras 330. The host controller 309 and/or the controller 310 can determine based on the input, a threshold related to the one or more attributes of the image data. A threshold for an attribute of a photograph generating from the front camera 330-1 can be different than a threshold for an attribute of a photograph generated by the back camera 330-N. As such, the host controller 309 and/or the controller 310 can determine, based on the threshold, a setting to determine a memory media type of the plurality of memory media types (e.g., DRAM 312, SCM 314, and/or NAND 316), where the setting can be different based on the location of the camera 330 that generated the image. The host controller 309 and/or the controller 310 can write, based on the setting, the image data (e.g., the photographs) to one of the plurality of memory media types.

The host controller 309 and/or the controller 310 can apply multiple settings to photographs (e.g., image data) received from one or more cameras 330 (e.g., image sensors). In some embodiments, each setting can correspond to one or more memory media types (e.g., DRAM 312, SCM 314, and/or NAND 316), and based on if the image data is above or below a threshold corresponding to each setting, the image data can be written in a particular memory media type. For example, a first setting can include a first threshold, and responsive to receiving a first image from one or more cameras 330 (e.g., images sensors) the host controller 309 and/or the controller 310 can determine if the first image is above or below a first threshold corresponding to the first setting. If the first image has attributes that are above the first threshold corresponding to the first setting, the host controller 309 and/or the controller 310 can write the first image to DRAM 312. If the first image is below the first threshold corresponding to the first setting, the host controller 309 and/or the controller 310 can write the first image to SCM 314 and/or NAND 316. Using these methods, each setting can correspond to a plurality of memory media types.

Continuing with the previous example, a second setting can include a second threshold, and responsive to receiving a second image from one or more cameras 330 (e.g., images sensors) the host controller 309 and/or the controller 310 can determine if attributes of the second image is above or below a second threshold corresponding to the second setting. If the second image has attributes that are above the threshold corresponding to the second setting the host controller 309 and/or the controller 310 can write the second image to SCM 314. If attributes of the second image are below the second threshold corresponding to the second setting the host controller 309 and/or the controller 310 can write the second image to NAND 316.

In other embodiments, the host controller 309 and/or the controller 310 can refrain from writing the image data (e.g., delete the image data) and/or write the image data in a particular memory media type (e.g., DRAM 312, SCM 314, and/or NAND 316) to be potentially deleted from the mobile device 302 responsive to review by a user. For example, the host controller 309 and/or the controller 310 can apply one or more settings to a plurality of photographs generated from one or more cameras 330. The plurality of photographs can be written as described above to particular memory media types based on the thresholds of the applied settings, and responsive to a determination that the attributes of a portion of the plurality of photographs are not desired (e.g., blurry, unwanted objects, etc.) the host controller 309 and/or the controller 310 can write the data to a particular memory media type (e.g., NAND 316) to be reviewed by a user of the mobile device 302 for deletion.

Figure 4:
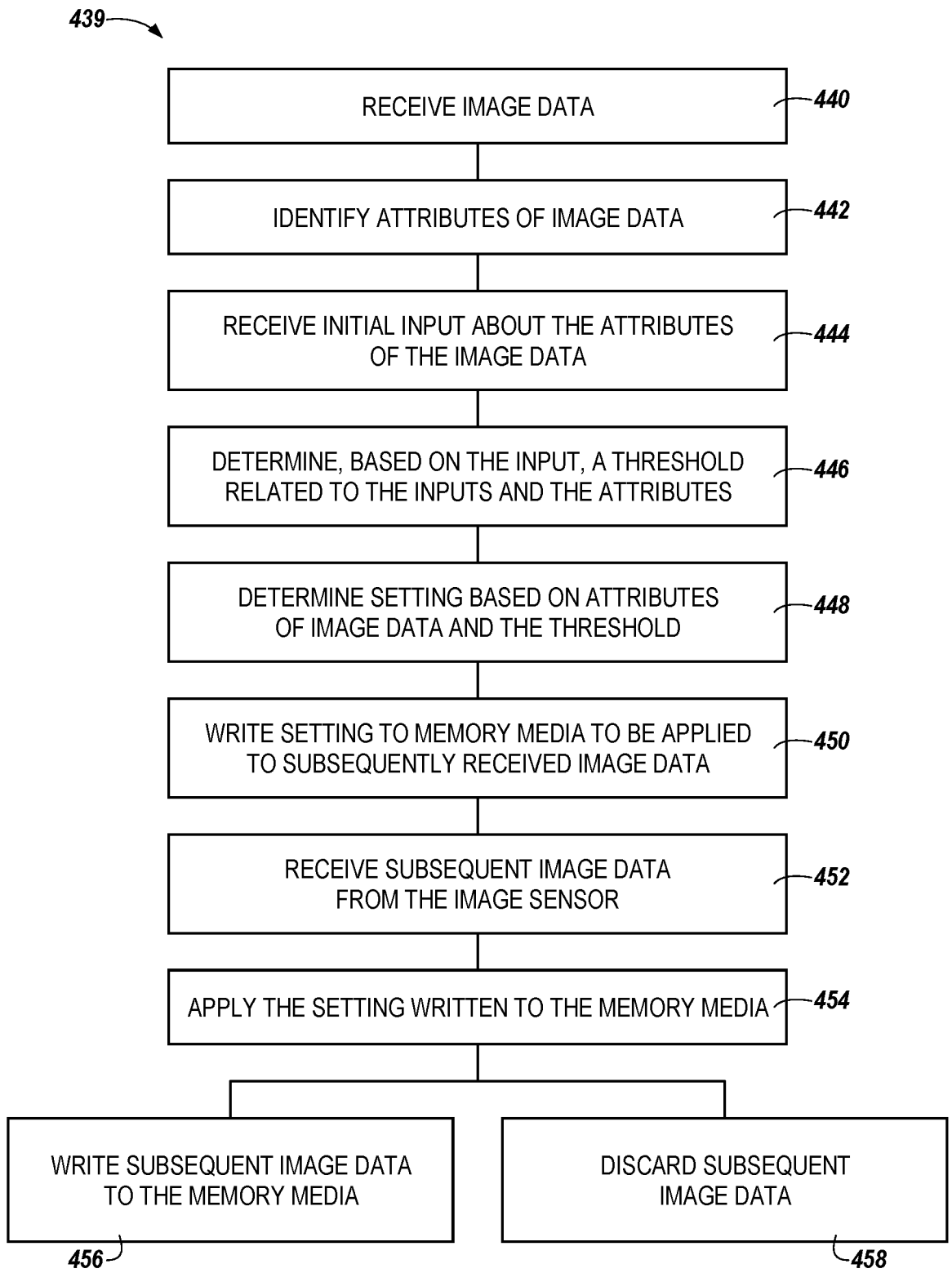
FIG. 4 is a flow diagram representing an example of image data based media type selection in accordance with a number of embodiments of the present disclosure.

FIG. 4 is a flow diagram 439 representing an example of image data based media type selection in accordance with a number of embodiments of the present disclosure. FIG. 4 describes an example of a generation of a setting based on initial input from a user and/or a host (e.g., the host 202 of FIG. 2) and attributes of image data (e.g., initial image data 231 of FIG. 2).

In an embodiment described in connection with FIG. 4, a host controller (e.g., the host controller 209) can be coupled to a host device such as a mobile device (e.g., mobile device 302 of FIG. 3). A controller (e.g., the controller 210 of FIG. 2) can be coupled to a memory system (e.g., the memory system 104 of FIG. 1) including a plurality of memory media types (e.g., DRAM 112, SCM 114, and/or NAND 116, of FIG. 1). At 440, the flow diagram 439, includes a host controller and/or a controller of a memory system configured to receive image data. The image data (e.g., one or more photographs) can be generated from one or more image sensors (e.g., the cameras 330 of FIG. 3) coupled to the host. The image data can include one or more one or more attributes.

At 442, the flow diagram 439 describes the host controller and/or the controller coupled to a memory system can identify attributes of the image data. For example, the controller can identify attributes such as a level of blur of a subject or a facial expression of a subject. The controller can prompt a host and/or a user for input about the attributes of the image data to generate a setting about the image data. For example, a setting can be generated from initial input corresponding to attributes of initial image data. A setting can be generated and applied to subsequent image data.

At 444, the flow diagram 439 includes describing the controller (and/or host controller) to receive the initial input about the attributes of the image data. For example, the image data can be a photograph of a smiling baby. The initial input can be an input from a host (e.g., a user) that photographs of a smiling baby should be written in a particular memory media type. Photographs of a non-smiling baby are to be written in a different memory media type and/or deleted from the host. In this example, the controller and/or host controller can, at block 446, determine, based on the input from the user, a threshold related to the inputs and the attributes. In an example embodiment, the threshold can be a threshold amount of smile (e.g., or other facial expression) of a subject in a photograph. Said differently, the controller can prompt a user for input about a photograph (or a plurality of photographs), where the input is whether to keep or discard the photographs. The photographs can include subjects with different facial expressions (or other attributes) and the controller can generate a setting based on the input. Put another way, the controller can determine, based on the threshold, a memory media type of the plurality of memory media types to write the image data to based on the input.

At 448, the controller and/or the host controller can determine a setting based on attributes (e.g., facial expression) of image data and the determined threshold. In this example, the setting can be to write images having attributes above a threshold (e.g., an amount of smiling) to a first type of memory media (e.g., DRAM) and to write images having attributes below the threshold to a different memory media type (e.g., SCM or NAND). The setting based on the attributes (facial expression) can be written to a particular memory media type of the plurality of memory media types to be applied to other images received by the memory system. At 450, the controller (or the host controller) can write the setting (about the threshold facial expression) to memory media to be applied to subsequently received image data.

For example, at 452, the controller and/or the host controller can receive subsequent image data (additional photographs) from the image sensor (camera coupled to the mobile device) and at 454, apply the setting (about the facial expression attributes) to the subsequent image data. In other words, the controller and/or the host controller can receive subsequent images of a baby and apply the previously written setting about the threshold facial expression attribute. In some examples, responsive to determining that the attributes of the subsequently received image data are sufficient (based on the setting), at 456 the controller and/or the host controller can write (based on the applied setting) the subsequent image data to a particular memory media type of the plurality of memory media types. In other examples, the subsequently received image data can be written to a different memory media type to be deleted and/or written to be reviewed for deletion by a user and/or the host.

At 458, the controller and/or the host controller can discard (based on the applied setting) the subsequent image data. In other words, the controller and/or the host controller can receive subsequent images of a baby and apply the previously written setting about the threshold facial expression attribute. In this example, responsive to determining that the attributes of the subsequently received image data are insufficient (based on the thresholds of the facial expression setting), the controller and/or the host controller can discard the subsequent image data or write the subsequent image data in a particular memory media type.

Figure 5:
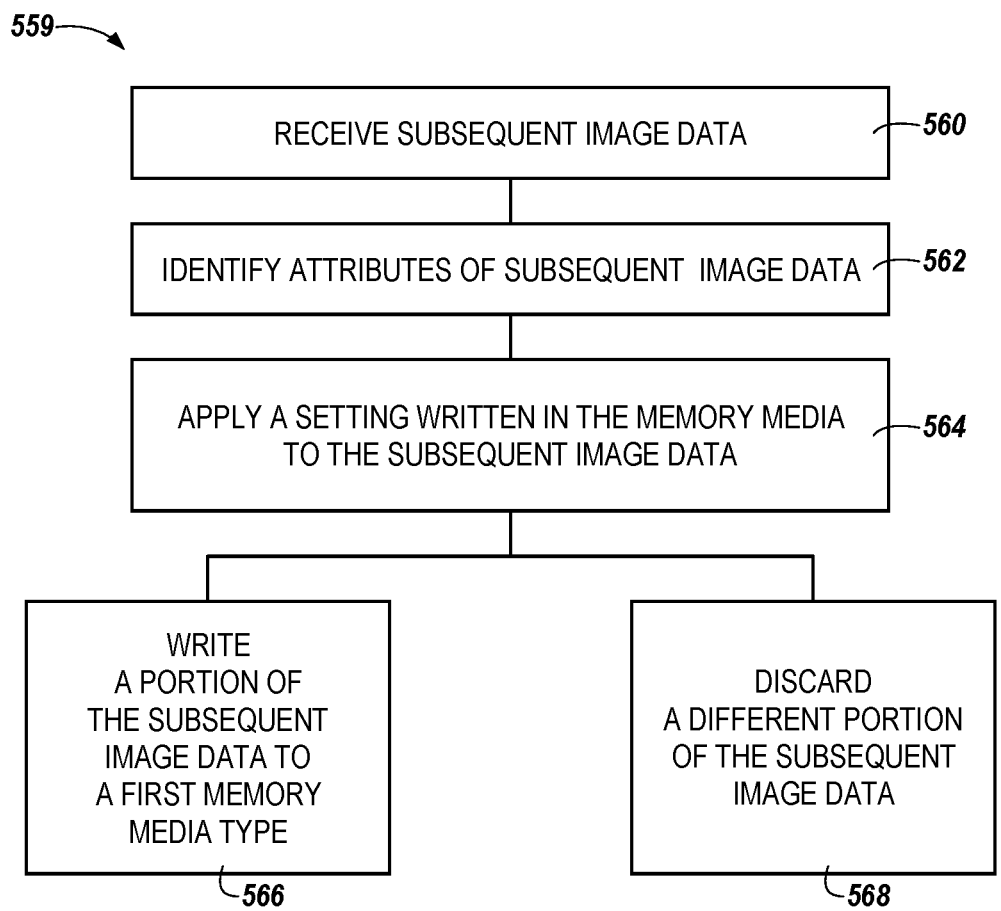
FIG. 5 is another flow diagram representing an example of image data based media type selection in accordance with a number of embodiments of the present disclosure.

FIG. 5 is another flow diagram 559 representing an example of image data based media type selection in accordance with a number of embodiments of the present disclosure. FIG. 5 describes an example of applying a setting (e.g., determining a memory media type to write image data to) generated based on initial input from a user and/or a host (e.g., the host 202 of FIG. 2) and attributes of initial image data (e.g., initial image data 231 of FIG. 2) to subsequently received image data (e.g., the subsequent image data 233 of FIG. 2).

As described herein in connection with FIG. 4, a host controller (e.g., the host controller 209) can be coupled to a host device such as a mobile device (e.g., mobile device 302 of FIG. 3). A controller (e.g., the controller 210 of FIG. 2) can be coupled to a memory system (e.g., the memory system 104 of FIG. 1) including a plurality of memory media types (e.g., DRAM 112, SCM 114, and/or NAND 116, of FIG. 1). Settings can be generated by the memory system and/or the host to write image data in particular memory media types of the plurality of memory media types. A setting generated based on the attributes of initial image data can be applied to subsequent image data. In some examples, the subsequent image data can include a number of portions.

At 560, the controller and/or the host controller can receive subsequent image data. The subsequent image data can be a number of photographs generated by an image sensor in the form of a camera (e.g., the cameras 330 of FIG. 3) coupled to a mobile device. The controller and/or the host controller can identify the attributes of the subsequent image data at 562. The attributes of the subsequent image data can vary when more than one image is generated by the cameras. For example, each photograph included in the subsequent image data can have different attributes (e.g., different levels of blur, different levels of facial expressions, different subjects, etc.). As such, a written setting including a particular threshold for an attribute can affect the subsequent image data differently.

At 564, the controller and/or the host controller can apply a setting written in the memory media (e.g., DRAM, SCM, and/or NAND) to the subsequent image data. Responsive to the determination that a portion of the subsequent image data is satisfactory (based on a threshold included in the setting) the controller and/or the host controller at 566 can write a (satisfactory) portion of the subsequent image data to a first memory media type (e.g., DRAM). Said differently, a portion of the subsequent image data can include subjects that include a facial expression (e.g., a smile) that is at or above a threshold included in a previously established setting, and the portion of photographs of smiling subjects can be written in DRAM. In some examples, a different portion of the subsequent image data can be below the threshold (e.g., unsatisfactory).

Responsive to the determination that a different portion of the subsequent image data is unsatisfactory (based on a threshold included in the setting) the controller and/or the host controller at 568 can discard the different portion of the subsequent image data. In some embodiments, the controller and/or the host controller can write the (unsatisfactory) portion of the subsequent image data to a second memory media type (e.g., SCM or NAND). The controller and/or the host controller can prompt a user to review the unsatisfactory image data to be discarded. Said differently, a different portion of the subsequent image data can include subjects that include a facial expression (e.g., devoid of a smile) that is below a threshold included in a previously established setting, and the different portion of photographs of non-smiling subjects can be written in SCM or NAND for later disposal.

In some embodiments, the user can review the unsatisfactory image data written in SCM or NAND and provide different input that can generate a new setting. For example, when subsequent data is received and/or when the user is reviewing image data written in the memory device, the user can provide new input that changes a threshold of facial expression (or other attribute) and generate a new setting (or change an old setting).

Figure 6:
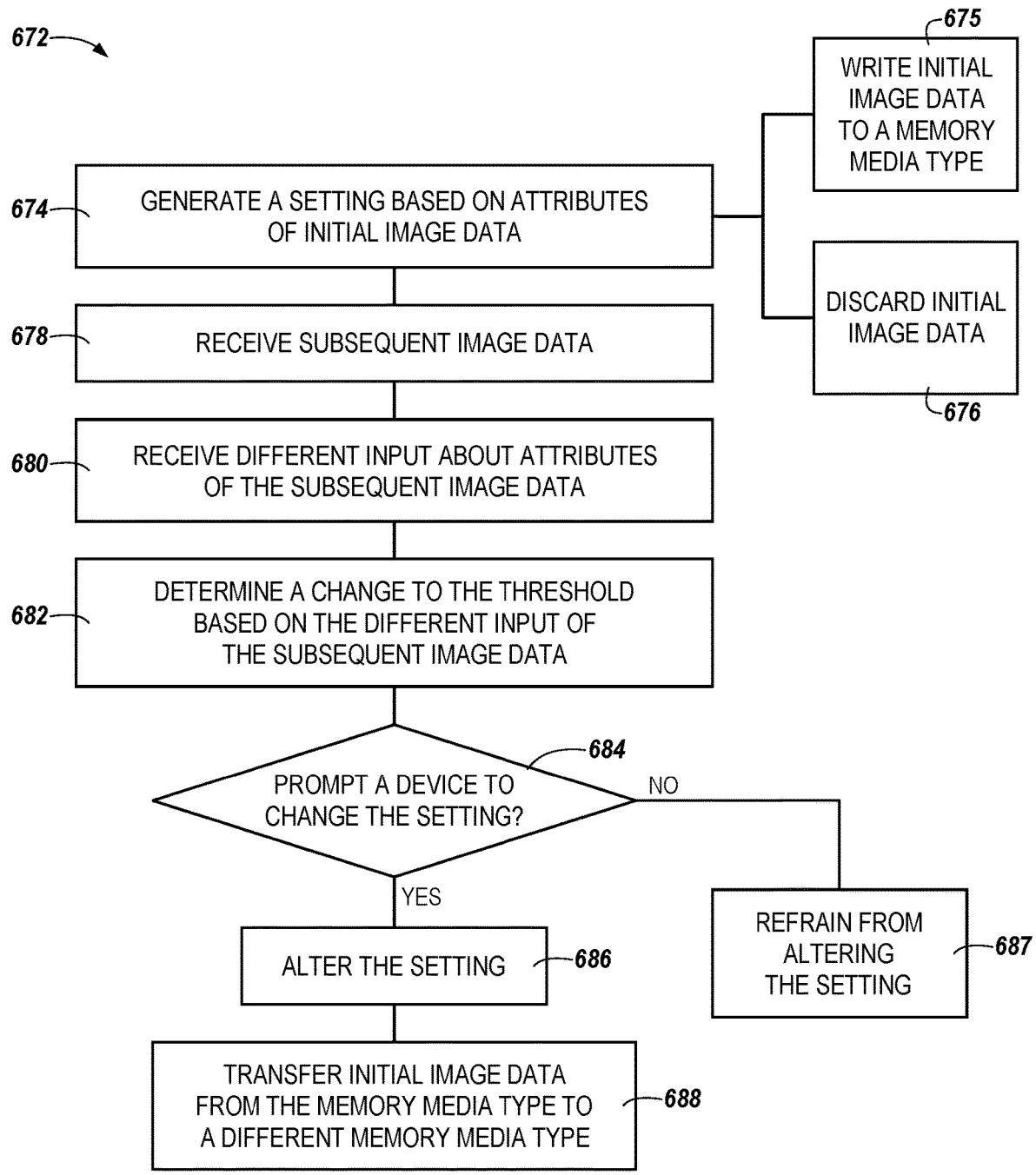
FIG. 6 is another flow diagram representing an example of image data based media type selection in accordance with a number of embodiments of the present disclosure.

FIG. 6 is another flow diagram 672 representing an example of image data based media type selection in accordance with a number of embodiments of the present disclosure. FIG. 6 describes an example of applying a setting generated based on initial input from a user and/or a host (e.g., the host 202 of FIG. 2) and attributes of initial image data (e.g., initial image data 231 of FIG. 2) to subsequently received image data (e.g., the subsequent image data 233 of FIG. 2).

As described herein in connection with FIGS. 4 and 5, a host controller (e.g., the host controller 209) can be coupled to a host device such as a mobile device (e.g., mobile device 302 of FIG. 3). A controller (e.g., the controller 210 of FIG. 2) can be coupled to a memory system (e.g., the memory system 104 of FIG. 1) including a plurality of memory media types (e.g., DRAM 112, SCM 114, and/or NAND 116, of FIG. 1). One or more settings can be generated by the memory system and/or the host to write image data in a particular memory media type of the plurality of memory media types. A setting generated based on the attributes of initial image data can be applied to subsequent image data. In some examples, the controller and/or the host controller can receive subsequent input responsive to receiving subsequent image data.

At 674, the controller and/or the host controller can generate a setting based on attributes of initial image data. For example, the initial image data may be photographs generated by a camera (e.g., the cameras 330 of FIG. 3) where the attributes of the photographs are a level of blur of the subjects. The setting generated can include a threshold level of blur where a level of blur at or above the threshold is satisfactory and may be written to a particular memory media type (e.g., DRAM) at 675. A level of blur below the threshold is unsatisfactory and may be written to different memory media type (e.g., SCM or NAND) for review by a user or the controller can discard the initial image data at 676 based on the applied setting.

The controller and/or the host controller at 678 can receive subsequent image data. The subsequent image data can include one or more portions of image data, where the one or more portions of subsequent image data can include different attributes than the initial image data. The controller and/or the host controller can receive different input about attributes of the subsequently received image data, where the different input changes the threshold (e.g., the threshold for blur associated with the setting). The controller and/or the host controller, at 682, can determine a change to the threshold based on the different input of the subsequent image data. In other words, a user may provide new input about a blur attribute responsive to the receipt of the subsequent image data. The additional input can include writing images that would have otherwise been deleted based on the previous threshold for blur corresponding to the previous setting.

The controller and/or the host controller can transmit a prompt at 684, to a user and/or a host (e.g., the mobile device) where the prompt is a conformation of a change to the setting based on the changes to the threshold (e.g., the threshold for blur previously established). The controller and/or the host controller can receive a response to the prompt. The user and/or the host respond to the prompt and, at 686, instruct the controller and/or the host controller to alter the setting to the new threshold established by the subsequent input, or refrain from altering the setting at 687 based on the subsequent input. Put another way, a determination can be made whether or not to alter a determined type of memory media based on the received response to the prompt.

Optionally, when a new setting is generated, at 688 the controller and/or the host controller can transfer the initial image data from the memory media type (e.g., DRAM) to a different memory media type (e.g., NAND or SCM). In some example embodiments, the controller and/or host controller can discard the initial image data previously written to DRAM based on the new setting.

Figure 7:
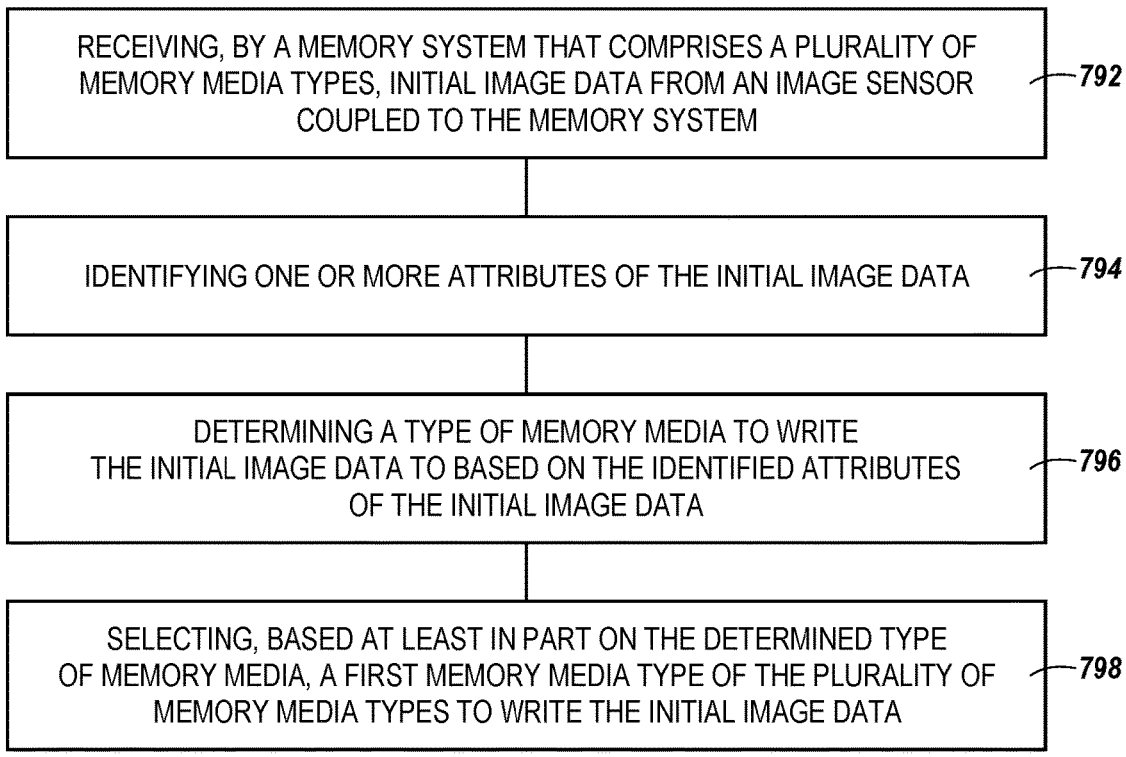
FIG. 7 is a flow diagram representing an example method for image data based media type selection in accordance with a number of embodiments of the present disclosure.

FIG. 7 is a flow diagram representing an example method 790 for image based media type selection in accordance with a number of embodiments of the present disclosure. At block 792, the method 790 can include receiving, by a memory system (e.g., the memory system 104 of FIG. 1) that comprises a plurality of memory media types (e.g., DRAM 112, SCM 114, and/or NAND 116), initial image data (e.g., initial image data 231 of FIG. 2) from an image sensor (e.g., image sensor 230) coupled to the memory system. The image data can be photographs generated from an image device in the form of a camera (e.g., the cameras 330 of FIG. 3). Each of the photographs can include attributes such as quantity of similar subjects within the plurality of photographs, pixel quality of the photographs, and a geographical location of the plurality of photographs, a quality of the subject in the photographs, facial expression, focus of a subject, etc.

At block 794, the method 790 can include identifying one or more attributes of the initial image data. The attributes of the initial image data can be used by a controller (e.g., the controller 110 of FIG. 1) and/or a host controller (e.g., the host controller 109 of FIG. 1) to generate a setting. The setting can be used to determine a memory media type of the plurality of memory media types to write the initial image data. For example, at 796, the method 790 can include determining a type of memory media to write the initial image data to based on the identified attributes of the initial image data. For instance, this can include applying a setting to the initial image data based on the attributes of the initial image data, wherein the setting determines a type of memory media to write the initial image data. The setting generated from the initial data can include a threshold of the attribute and based on the threshold, the initial image data can be written to a memory media type.

At block 798, the method 790 can include selecting, based at least in part on the determined type of memory media (e.g., based on an applied setting), a first memory media type (e.g., DRAM) of the plurality of memory media types to write the initial image data. The determined type of memory media (e.g., the applied setting) can in some embodiments change based on additional input and/or subsequently received image data (e.g., the subsequent image data 233), or both.

For example, the method 790 can include receiving subsequent image data from the image sensor coupled to the memory system and determining attributes of the subsequent image data. The attributes of the subsequent image data can be different than the attributes of the initial image data. In some examples, the attributes of the subsequently received image data can elicit new input from a user and/or a host.

For example, the method 790 can include receiving input about the attributes of the subsequent image data and applying a new setting to the subsequent image data, based at least in part on the input about the attributes of the subsequent image data.

In some embodiments, the method 790 can include transferring the initial image data from the first memory media type (DRAM) to a second memory media type (e.g., SCM or NAND) based on the new setting. Further, as described herein, the subsequent image data can include one or more portions that can be written in memory media differently based on the new setting. For example, the method 790 can include discarding a first portion of the subsequent image data received, based at least in part on the new setting and writing a second portion of the subsequent image data received to a second memory media type (e.g., SCM or NAND) of the plurality of memory media types.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 a plurality of memory media types; and
 a controller coupled to the plurality of memory media types, wherein the controller is configured to:
  receive initial image data from an image sensor coupled to the controller;
  generate a setting corresponding to attributes of the initial image data,
   wherein the setting comprises a threshold that is machine learned from inputs comprising information about attributes included in the initial image data;
  determine a first type of memory media to write the initial image data to based on the setting;
  write the initial image data to the first type of memory media;
  receive subsequent image data from the image sensor;
  generate a new setting corresponding to attributes of the subsequent image data;

determine a second, different type of memory media to write the subsequent image data to based on the new setting;

discard a first portion of the subsequent image data received, based at least in part on the different type of memory media; and write a second portion of the subsequent image data received to the different memory media type of the plurality of memory media types.

2. The apparatus of claim 1, comprising the controller configured to write the subsequently received image data to a second type of memory media of the plurality of memory media types based on the setting.

3. The apparatus of claim 1, further comprising the controller configured to discard the subsequently received image data to a second type of memory media of the plurality of memory media types based on the setting.

4. The apparatus of claim 1, comprising the controller configured to generate new settings with new thresholds as additional image data is received at the controller.

5. The apparatus of claim 1, wherein the controller is configured to generate the setting based on a location of an autonomous vehicle host device.

6. The apparatus of claim 1, comprising the controller configured to determine an allowed threshold amount of at least one of the attributes of the initial image data.

7. The apparatus of claim 1, comprising the controller configured to write one or more bits of data that indicate the determined type of memory media to the at least one of the plurality of memory media types.

8. The apparatus of claim 1, wherein the plurality of memory media types includes at least one of dynamic random-access memory (DRAM), storage class memory (SCM), or NAND.

9. The apparatus of claim 1, comprising the controller configured to:

write the new setting to at least one of the plurality of memory media types; and apply the setting, the new setting, or both to subsequently received image data.

10. The apparatus of claim 1, comprising the controller configured to discard the initial image data previously written to the first memory media type based on the determined different type of memory media.

11. A method, comprising:

receiving initial input about an attribute of initial image data received from an image sensor, determining a first setting based on the initial input and based on a location of a host device;

wherein the first setting comprises a threshold that is machine learned from inputs comprising information about attributes included in the initial image data to the apparatus;

determining a first type of memory media of the plurality of memory media types to write the initial image data to based on the first setting;

writing, based on the first setting, the initial image data to a first memory media type;

determining a second setting based on the initial input, additional input, the first setting, and based on a location of the host device;

transferring the initial image data from the first memory media type to a second, different memory media type responsive to the determination of the second setting;

receiving subsequent image data from the image sensor;

generating a new setting corresponding to attributes of the subsequent image data;

determining a second, different type of memory media to write the subsequent image data to based on the new setting;

discarding a first portion of the subsequent image data received, based at least in part on the different type of memory media; and writing a second portion of the subsequent image data received to the different memory media type of the plurality of memory media types.

12. The method of claim 11, further comprising:

receiving new input about attributes of the subsequent image data, wherein the new input and the initial input are different, and the new input identifies changes to one or more thresholds related to the attributes of the subsequent image data;

determining a third setting based on the new input; and determining a different type of memory media to write the subsequent image data to based in part on the third setting.

13. A system, comprising:

an image sensor;

a plurality of memory media types coupled to the image sensors; and a controller coupled to the plurality of memory media types, wherein the controller is configured to:

generate a setting based on attributes associated with received initial image data and based on a location of a host device, wherein the setting comprises a threshold that is machine learned from inputs comprising information about attributes included in the initial image data to the memory system;

in response to the initial image data meeting or exceeding a threshold associated with the setting, write the initial image data to a first memory media type;

in response to the initial image data not meeting or exceeding the threshold, discard the initial image data; and determine a change to the threshold based on additional input received and associated with received subsequent image data, wherein the subsequent image data includes a number of portions, and the controller is configured to:

write a first portion of the subsequent image data to the first memory media type based on the setting;

transfer the initial image data from the first memory media type to a second memory media type based on the setting; and discard a second portion of subsequent image data based on the setting.

14. The system of claim 13, comprising the controller configured to transfer the initial image data from the first memory media type to the second memory media type in response to the setting alteration.

15. The system of claim 13, wherein the attribute comprises at least one of: subject blur, pixel characteristics, pixel density, subject features, and subject focus.

16. The system of claim 13, wherein the setting is based on attributes related to a quality of subjects in the initial image data.

* * * * *